(12) United States Patent
Mizushima et al.

(10) Patent No.: US 8,624,316 B2
(45) Date of Patent: Jan. 7, 2014

(54) NONVOLATILE SEMICONDUCTOR MEMORY DEVICE AND METHOD OF FABRICATING THE SAME

(75) Inventors: Ichiro Mizushima, Kanagawa-ken (JP); Yoshiaki Fukuzumi, Kanagawa-ken (JP); Shinji Mori, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/227,882

(22) Filed: Sep. 8, 2011

(65) Prior Publication Data

US 2012/0241841 A1 Sep. 27, 2012

(30) Foreign Application Priority Data

Mar. 24, 2011 (JP) ................................. 2011-065282

(51) Int. Cl.
*H01L 29/792* (2006.01)
(52) U.S. Cl.
USPC .............. 257/324; 257/E21.18; 257/E29.309; 438/591
(58) Field of Classification Search
USPC .............. 257/324, E29.309, E21.18; 438/591
See application file for complete search history.

(56) References Cited

U.S. PATENT DOCUMENTS

| | | | | |
|---|---|---|---|---|
| 4,982,251 A * | 1/1991 | Nakagawa et al. | ............. | 257/64 |
| 5,885,858 A * | 3/1999 | Nishimura et al. | ............ | 438/149 |
| 6,103,556 A * | 8/2000 | Nishimura et al. | ............ | 438/149 |
| 6,191,463 B1 * | 2/2001 | Mitani et al. | .................. | 257/411 |
| 8,178,919 B2 * | 5/2012 | Fujiwara et al. | .............. | 257/324 |
| 2003/0127665 A1 * | 7/2003 | Shih | .............. | 257/213 |
| 2004/0232469 A1 * | 11/2004 | Fukuzumi | ...................... | 257/310 |
| 2006/0284241 A1 * | 12/2006 | Kim | ............................... | 257/316 |
| 2007/0252201 A1 * | 11/2007 | Kito et al. | ..................... | 257/331 |
| 2008/0099819 A1 * | 5/2008 | Kito et al. | ..................... | 257/315 |
| 2008/0128773 A1 * | 6/2008 | Moll et al. | .................... | 257/300 |
| 2008/0217674 A1 * | 9/2008 | Watanabe | ..................... | 257/316 |

(Continued)

FOREIGN PATENT DOCUMENTS

| | | |
|---|---|---|
| JP | 58-123772 | 7/1983 |
| JP | 2-130932 | 5/1990 |

(Continued)

OTHER PUBLICATIONS

Yoshinobu Nakagome, et al., "A Comparison of the thermal Stabilities of Fluorinated and Hydrogenated Amorphous-Silicons", Japanese Journal of Applied Physics, vol. 19, No. 2, Feb. 1980, pp. L87-L89.

(Continued)

*Primary Examiner* — Stephen W Smoot
*Assistant Examiner* — Michael Hung
(74) *Attorney, Agent, or Firm* — Oblon, Spivak, McClelland, Maier & Neustadt, L.L.P.

(57) ABSTRACT

According to one embodiment, a semiconductor device, including a substrate, a stacked layer body provided above the substrate, the stacked layer body alternately stacking an insulator and an electrode film one on another, silicon pillars contained with fluorine, the silicon pillar penetrating through and provided in the stacked layer body, a tunnel insulator provided on a surface of the silicon pillar facing to the stacked layer body, a charge storage layer provided on a surface of the tunnel insulator facing to the stacked layer body, a block insulator provided on a surface of the charge storage layer facing to the stacked layer body, the block insulator being in contact with the electrode film, and an embedded portion provided in the silicon pillars.

9 Claims, 6 Drawing Sheets

(56) References Cited

U.S. PATENT DOCUMENTS

| | | | |
|---|---|---|---|
| 2008/0315291 A1* | 12/2008 | Kito et al. | 257/324 |
| 2009/0121282 A1* | 5/2009 | Kim | 257/324 |
| 2009/0146206 A1* | 6/2009 | Fukuzumi et al. | 257/324 |
| 2009/0179257 A1* | 7/2009 | Komori et al. | 257/326 |
| 2009/0294844 A1* | 12/2009 | Tanaka et al. | 257/330 |
| 2009/0321813 A1* | 12/2009 | Kidoh et al. | 257/324 |
| 2010/0034028 A1* | 2/2010 | Katsumata et al. | 365/185.28 |
| 2010/0038703 A1* | 2/2010 | Fukuzumi et al. | 257/326 |
| 2010/0044776 A1* | 2/2010 | Ishiduki et al. | 257/324 |
| 2010/0072538 A1* | 3/2010 | Kito et al. | 257/326 |
| 2010/0096682 A1* | 4/2010 | Fukuzumi et al. | 257/314 |
| 2010/0117137 A1* | 5/2010 | Fukuzumi et al. | 257/324 |
| 2010/0118610 A1* | 5/2010 | Katsumata et al. | 365/185.18 |
| 2010/0148237 A1* | 6/2010 | Kito et al. | 257/315 |
| 2010/0171162 A1* | 7/2010 | Katsumata et al. | 257/314 |
| 2010/0181612 A1* | 7/2010 | Kito et al. | 257/319 |
| 2010/0207195 A1 | 8/2010 | Fukuzumi et al. | |
| 2010/0213538 A1* | 8/2010 | Fukuzumi et al. | 257/326 |
| 2011/0227140 A1 | 9/2011 | Ishiduki et al. | |
| 2011/0233646 A1* | 9/2011 | Mizushima et al. | 257/324 |
| 2011/0256707 A1* | 10/2011 | Pachamuthu et al. | 438/593 |

FOREIGN PATENT DOCUMENTS

| | | |
|---|---|---|
| JP | 11-040803 | 2/1999 |
| JP | 2009-146954 | 7/2009 |
| JP | 2010-045149 | 2/2010 |
| JP | 2010-114370 | 5/2010 |

OTHER PUBLICATIONS

Hideki Matsumura, et al., "Structural model of sputtered fluorinated amorphous silicon", Journal of Applied Physics, vol. 52, No. 9, Sep. 1981, pp. 5537-5542.

Ichiro Mizushima, et al., "Improvement of Electrical Characteristics of Polycrystalline Silicon Films by Fluorine Ion Implantation", vol. J73-C-II, No. 12, Dec. 1990, pp. 894-897.

U.S. Appl. No. 13/346,888, filed Jan. 10, 2012, Fukuzumi, et al.

Japanese Office Action dated Jul. 26, 2013 regarding Japanese Patent Application No. 2011-065282 (with English translation).

* cited by examiner

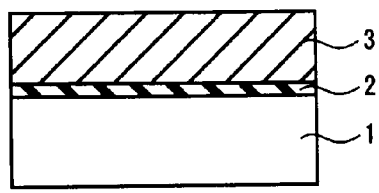
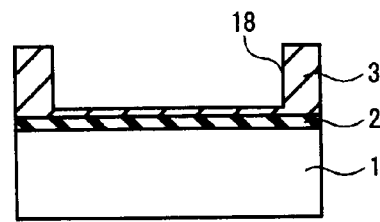
FIG.4A      FIG.4B
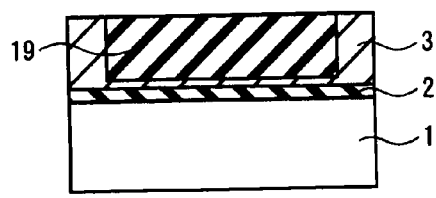
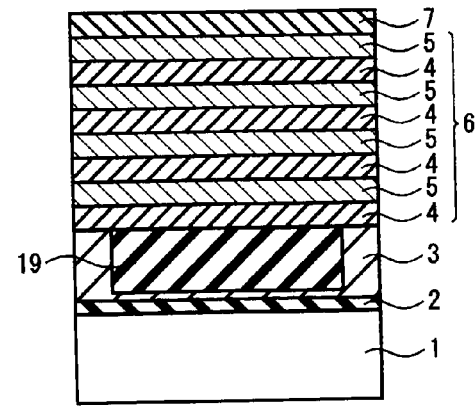
FIG.4C      FIG.4D
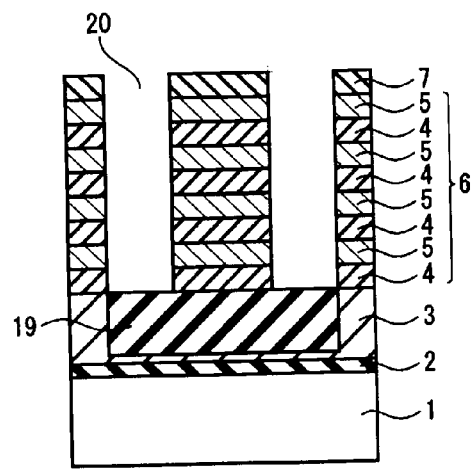
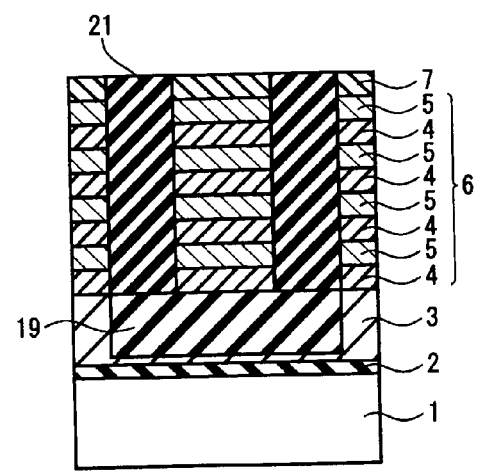
FIG.4E      FIG.4F
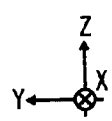

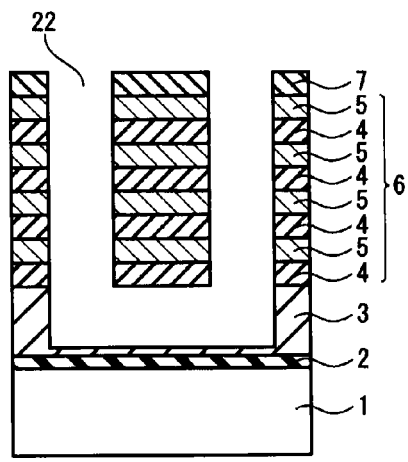
FIG.5A
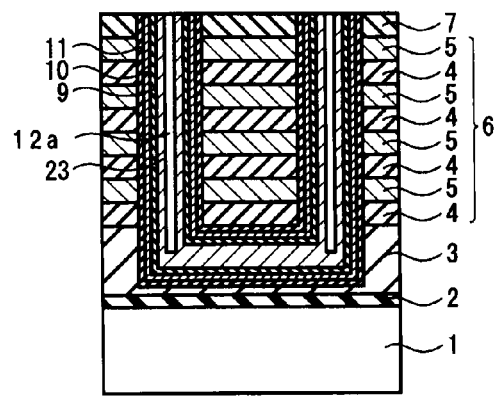
FIG.5B
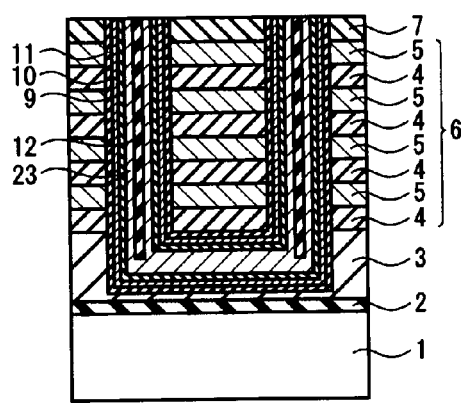
FIG.5C
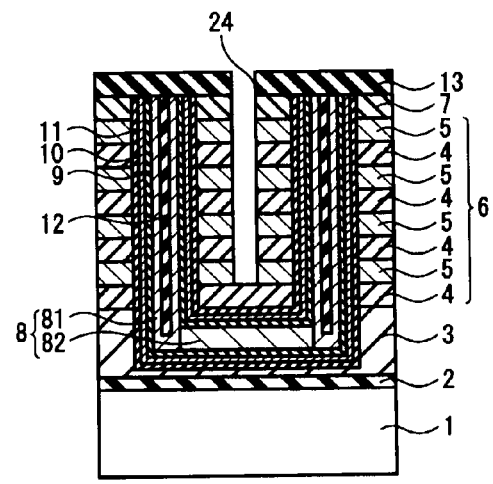
FIG.5D
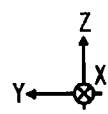

NONVOLATILE SEMICONDUCTOR MEMORY DEVICE AND METHOD OF FABRICATING THE SAME

CROSS REFERENCE TO RELATED APPLICATION

This application is based upon and claims the benefit of priority from prior Japanese Patent Application No. 2011-065282, filed on Mar. 24, 2011, the entire contents of which are incorporated herein by reference.

FIELD

Embodiments relate to a nonvolatile semiconductor memory device and a method of fabricating the nonvolatile semiconductor memory device.

BACKGROUND

Developments have been carried out on various types of nonvolatile semiconductor memory devices having a bit cost scalable (BiCS) structure in recent years. A three-dimensional BiCS structure achieves an increase in a memory capacity with lower costs.

A nonvolatile semiconductor memory device having the BiCS structure is produced by processing a stacked layer body at one operation. The number of bits can be increased as the layered number is increased. For this reason, the BiCS structure can decrease costs per bit.

On the other hand, a poly-crystalline semiconductor is used for a channel region in the nonvolatile semiconductor memory device using the BiCS structure. The structure mentioned above entails a problem that electron mobility is low in the channel.

BRIEF DESCRIPTION OF THE DRAWINGS

FIGS. 4A to 4F are cross-sectional views showing a method of fabricating a nonvolatile semiconductor memory device according to the embodiment;

FIGS. 5A to 5D are cross-sectional views showing a method of fabricating a nonvolatile semiconductor memory device according to the embodiment;

DETAILED DESCRIPTION

Figure 1:
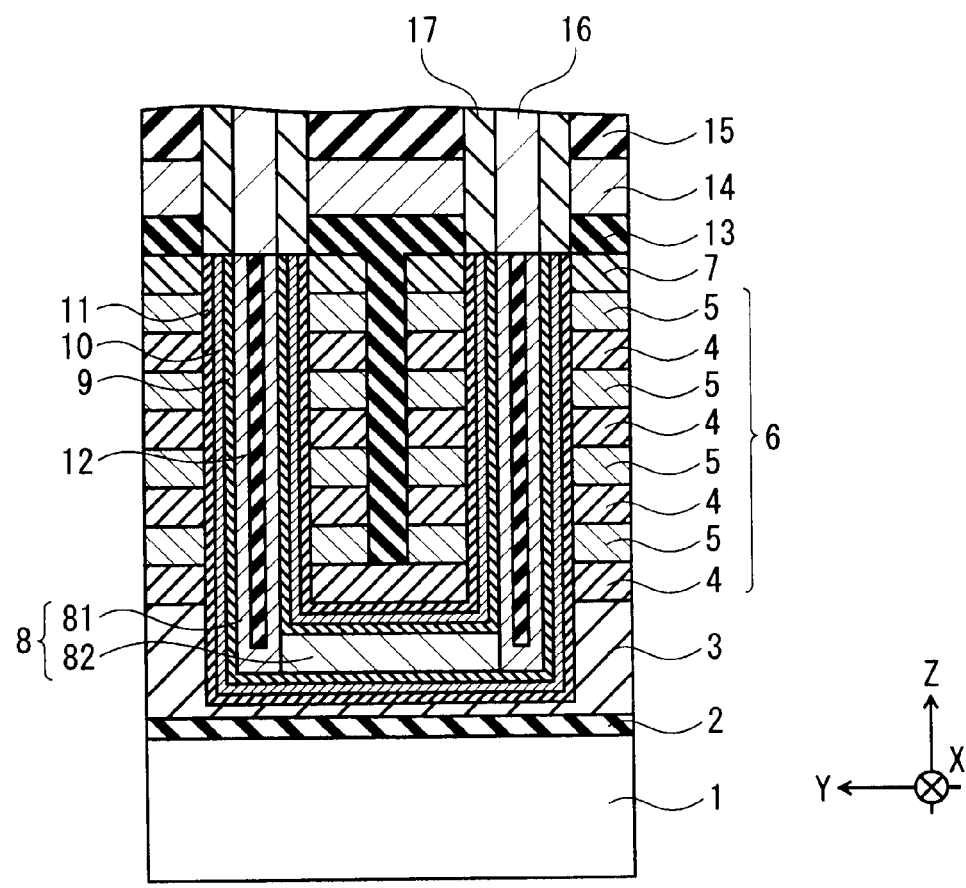
FIG. 1 is a cross-sectional view showing a nonvolatile semiconductor memory device according to an embodiment.

According to one embodiment, a semiconductor device, including a substrate, a stacked layer body provided above the substrate, the stacked layer body alternately stacking an insulator and an electrode film one on another, silicon pillars containing fluorine, the silicon pillar penetrating through and provided in the stacked layer body, a tunnel insulator provided on a surface of the silicon pillar facing to the stacked layer body, a charge storage layer provided on a surface of the tunnel insulator facing to the stacked layer body, a block insulator provided on a surface of the charge storage layer facing to the stacked layer body, the block insulator being in contact with the electrode film, and an embedded portion provided in the silicon pillars.

Descriptions will be hereinbelow provided for the embodiment while referring to the drawings.

Descriptions will be hereinbelow provided for a nonvolatile semiconductor memory device according to the embodiment.

FIG. 1 is a cross-sectional view showing a nonvolatile semiconductor memory device according to the embodiment. The descriptions will be provided by use of a XYZ-coordinate system. The X direction is a direction from the front to the back of the sheet on which the drawing is depicted. The Y direction is a direction from the right to the left of the sheet on which the drawing is depicted. The Z direction is a direction from the bottom to the top of the sheet on which the drawing is depicted. In the nonvolatile semiconductor memory device according to the embodiment, an impurity-diffused layer as a back gate is provided in an upper portion of a silicon substrate 1.

As shown in FIG. 1, a back gate insulator 2 and a back gate conductor 3 are provided on the silicon substrate 1.

A stacked layer body 6 is provided on the back gate conductor 3. The stacked layer body 6 is obtained by alternately stacking an insulator 4 and an electrode film 5 one on another. A silicon oxide film, for example, is used for each insulator 4. A poly-crystalline silicon film, for example, is used for each electrode film 5. Each electrode film 5 is used as a control gate electrode of a memory cell, which will be described later. Each insulator 4 has a function of insulating neighboring electrode films 5 across the insulator 4. FIG. 1 shows the stacked layer body 6 in which four insulators 4 and four electrode films 5 are stacked one on another alternately. However, the layered number is not limited to the above case. An isolation insulator 7 is provided on the stacked layer body 6. A silicon oxide film, for example, is used for the isolation insulator 7.

A plurality of silicon pillars 81 extending virtually perpendicularly to the silicon substrate 1 are provided to be surrounded by the stacked layer body 6 and the isolation insulator 7. In this respect, the silicon pillars 81 and a silicon connection portion 82, which will be described later, jointly constitute a silicon film 8. A poly-crystalline silicon film containing fluorine is used for the silicon film 8. The silicon film 8 functions as a channel in the nonvolatile semiconductor memory device according to the embodiment.

Figure 2:
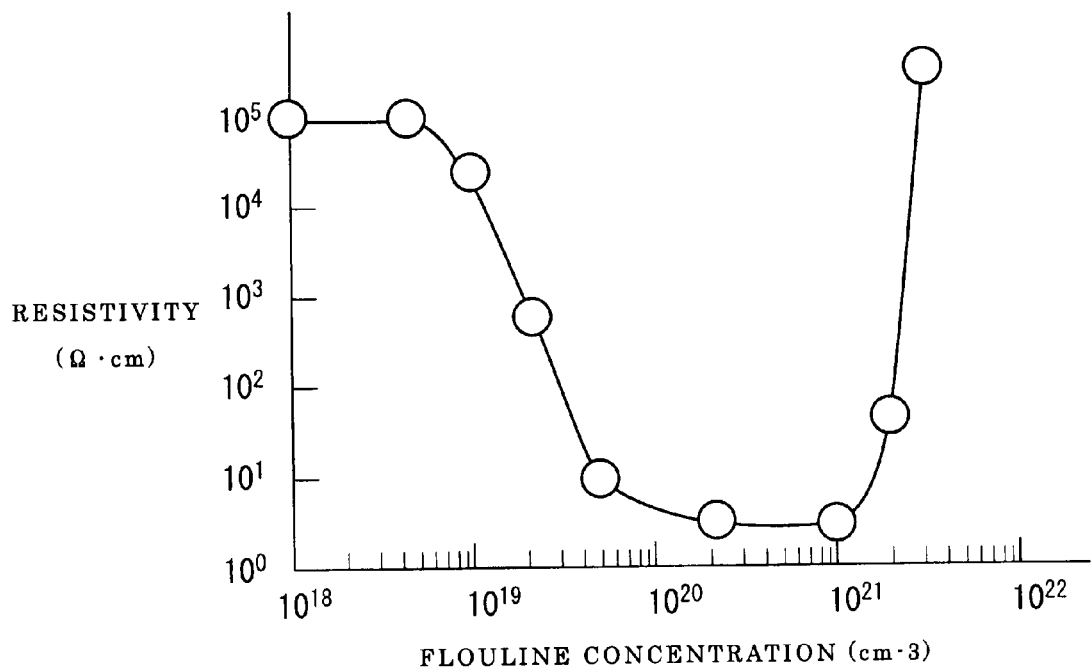
FIG. 2 is a diagram showing a resistivity of poly-crystalline silicon against a concentration of fluorine atoms.

Descriptions will be hereinbelow provided for a concentration of the fluorine contained in the poly-crystalline silicon. FIG. 2 is a diagram showing a resistivity of poly-crystalline silicon, in which a concentration of phosphorus is $4 \times 10^{18}$ cm$^{-3}$, against an atomic concentration of fluorine contained in the poly-crystalline silicon. As shown in FIG. 2, when the concentration of fluorine in the poly-crystalline silicon is equal to or greater than $2 \times 10^{19}$ cm$^{-3}$, the resistivity of the poly-crystalline silicon decreases because dangling bonds in grain boundaries of the poly-crystalline silicon are terminated by fluorine atoms. On the other hand, when the concentration of the fluorine in the poly-crystalline silicon is equal to or greater than $2 \times 10^{21}$ cm$^{-3}$, the resistivity increases because fluorine is present in the crystal grains of the poly-crystalline silicon. In this respect, when the concentration of fluorine in the silicon film 8 is converted to the atomic composition expressed in percentage, $2 \times 10^{19}$ cm$^{-3}$ is equivalent to 0.04%, and $2 \times 10^{21}$ cm$^{-3}$ is equivalent to 4%. In a case where the concentration of fluorine in the silicon film 8 is in a range of $2 \times 10^{19}$ cm$^{-3}$ to $2 \times 10^{21}$ cm$^{-3}$, namely 0.04% to 4%, the electron mobility increases in a channel, and the resistivity accordingly decreases. Incidentally, the concentration of fluorine in the embodiment is obtained by SIMS (Secondary Ion Mass Spectrometry) using cesium ions.

In the embodiment, the inclusion of fluorine with the above-mentioned concentration in the silicon film 8 reduces the trap density which is attributable to the dangling bonds in the grain boundaries in the poly-crystal of the silicon film 8 as the channel, and enhances the electron mobility in the channel. In a case where the cross-sectional area of the silicon pillars 81 becomes larger from a lower portion toward an upper portion, the number of fluorine atoms contained in the silicon pillars 81 may be larger in the uppermost portion of the silicon pillars 81 than in the lowermost portion of the silicon pillars 81. Particularly, the number of fluorine atoms may become larger toward the upper portion of the silicon pillars 81.

The silicon pillars 81 are arrayed in a matrix at equal intervals on the XY plane. The shape of each silicon pillar 81 is a hollow conic shape, an elliptic conic shape, a hollow cylindrical shape or an elliptic cylindrical shape, for example. The cross-sectional shape of each silicon pillar viewed in the Z direction is a circular shape or an elliptic shape, for example. In a case where the cross-sectional shape of the silicon pillar 81 is a circular shape, the diameter of the hole is 70 nm, for example, while the height of the silicon pillar 81 is 2.1 μm, for example.

The silicon connection portion 82 to connect lower end portions of the respective paired silicon pillars 81 together is provided in the back gate conductor 3. The silicon connection portion 82 is made from poly-crystalline silicon containing fluorine, for example.

A tunnel insulator 9 is provided on a surface of each silicon pillar 81 which faces to the stacked layer body 6. A silicon oxide film, for example, is used for the tunnel insulator 9.

A charge storage layer 10 is provided on a surface of the tunnel insulator 9 which faces to the stacked layer body 6. A silicon nitride film, for example, is used for the charge storage layer 10.

A block insulator 11 is provided on a surface of the charge storage layer 10 which faces to the stacked layer body 6, and is in contact with the electrode films 5 and the insulators 4. A silicon oxide film, for example, is used for the block insulator 11.

It should be noted that the films of the tunnel insulator 9, the charge storage layer 10 and the block insulator 11 are provided to surround not only the silicon pillars 81 but also the silicon connection portion 82.

An embedded portion 12 extending in the layered direction of the stacked layer body 6 is provided in each silicon pillar 81 of the silicon film 8. It is desirable that the embedded portion 12 should be an insulating portion containing fluorine, for example. However, the embedded portion 12 does not necessarily have to contain fluorine. In the case where the embedded portion 12 is an insulating portion, the interface state density in the interface between the corresponding silicon pillar 81 and the embedded portion 12 can be reduced. For this reason, when no voltage is applied to the gate electrode, it is possible to inhibit the flow of an electric current into the channel. A silicon oxide film containing fluorine, for example, is used for the embedded portion 12. Instead, the embedded portion 12 may be made of a film containing fluorine such as a silicon nitride film, a silicon oxynitride film, or a layered film of a silicon oxide film and a silicon nitride film.

Fluorine atoms are diffused from the embedded portions 12 into the poly-crystalline silicon in the silicon pillars 81 in contact with the embedded portions 12 and the silicon connection portion 82, and terminate dangling bonds in the poly-crystalline silicon.

In a case where dangling bonds in the poly-crystal are present in the interface between the silicon film 8 and each embedded portion 12, the electron mobility in the channel decreases. However, in the embodiment, the dangling bonds in the interface between the silicon film 8 and the embedded portion 12 are sufficiently terminated by using fluorine, because the embedded portion 12 contains fluorine during the film formation. This termination inhibits the decrease in the electron mobility in the channel.

Each embedded portion 12 needs to contain fluorine during the film formation. On the other hand, the embedded portion 12 no longer has to contain fluorine after fluorine is diffused into the poly-crystalline silicon. The concentration of fluorine contained in the embedded portion 12 during the film formation is equal to or greater than 0.1%, for example, as the atomic composition expressed in percentage.

In the BiCS structure shown in the embodiment, the area of the contact between the embedded portion 12 and the silicon pillar 81 is smaller than the area of the contact between the tunnel insulator 9 and the silicon pillar 81. On the other hand, in a planar type nonvolatile semiconductor memory device formed on an SOI (silicon-on-insulator) substrate, an insulator is formed in the silicon substrate, while a tunnel insulator, a charge storage layer, a block insulator and an electrode film are formed on the silicon layer in the surface of the SOI substrate. Since the area of the contact between the tunnel insulator and the silicon substrate is almost equal to the area of the contact between the insulator in the SOI substrate and the silicon substrate, the BiCS structure can reduce the interface state in the interface between the embedded portion 12 and the silicon pillar 8 by using a smaller amount of fluorine than the conventional planar type nonvolatile semiconductor memory device. Thus, the BiCS structure is advantageous in that metal interconnections are less likely to corrode due to fluorine.

The shape of each embedded portion 12 is a conic shape, an elliptic conic shape, a cylindrical shape or an elliptic cylindrical shape, for example. The cross-sectional shape of the embedded portion 12 viewed in the Z direction is a circular shape or an elliptic shape, for example. The embedded portion 12 may be in a reverse tapered shape in which the cross-sectional area of the cross-sectional circle of the embedded portion 12 viewed in the Z direction becomes smaller toward the lowermost layer of the stacked layer body 6.

Figure 3:
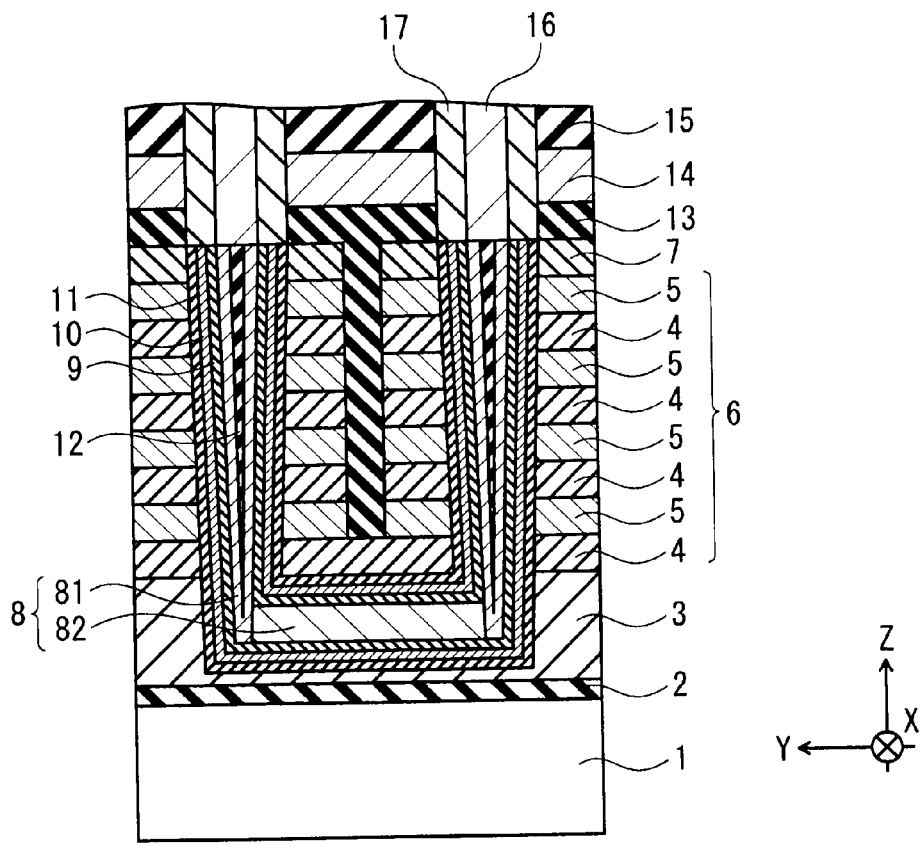
FIG. 3 is a cross-sectional view showing a nonvolatile semiconductor memory device according to the embodiment.

In the case where the embedded portion 12 is in the reverse tapered shape, the embedded portion 12 has a larger cross-sectional area and accordingly contains a larger number of fluorine atoms toward the topmost layer of the stacked layer body 6. Thus, as shown in FIG. 3, the poly-crystalline silicon film becomes more dominant toward the lowermost portion of the silicon pillar 81. In the case where the volume of the silicon pillar 81 is larger in the upper portion than in the lower portion, the upper and lower portions of the silicon pillar 81 has a small difference in the number of fluorine atoms per unit volume. In other words, the electron mobility is equalized throughout the silicon pillar 81, and the reliability of the nonvolatile semiconductor memory device can be enhanced.

Stacked films of memory protection insulators 13, select gate electrodes 14 and insulation layers 15, are sequentially provided on the isolation insulator 7. Silicon films 16 are provided in the staked films to extend in a direction virtually perpendicular to the silicon substrate 1, and are connected to the silicon film 8. Gate insulators 17 are provided to surround the respective silicon films 16. Incidentally, the silicon films 16 are made of a poly-crystalline silicon, and the poly-crystalline silicon may contain fluorine. The select gate electrodes 14 have plate-like shapes which extend in parallel to the X direction, and are formed to be electrically insulated and isolated from one another.

The embodiment provides the nonvolatile semiconductor memory device having the three-dimensional structure with the silicon film 8 containing fluorine as the channel. Thereby, the embodiment can provide the nonvolatile semiconductor memory device which inhibits the decrease in the electron mobility.

Furthermore, the embodiment makes it possible to enhance the electron mobility in the channel, because the embodiment sufficiently terminates the dangling bonds in the interface between the silicon film 8 and the embedded portions 12 by use of fluorine.

Descriptions will be hereinbelow provided for a method of fabricating a nonvolatile semiconductor memory device according to the embodiment.

FIGS. 4A to 6D are cross-sectional views showing the method of fabricating a nonvolatile semiconductor memory device according to the embodiment, which are taken along the YZ plane.

As the back gate, the impurity-diffused layer is formed in an upper portion of the silicon substrate 1 by ion-implantation. Subsequently, as shown in FIG. 4A, the back gate insulator 2 and the back gate conductor 3 are formed on the silicon substrate 1.

Thereafter, as shown in FIG. 4B, an opening portion 18 is formed by etching a part of the back gate conductor 3 using lithography and RIE (reactive ion etching). The opening portion 18 is provided for the purpose of forming the silicon connection portion 82, to which the below-described paired silicon pillars 81 are connected. Incidentally the shape of the opening portion 18 viewed in the Z direction is a strip-like shape, for example.

Afterward, as a sacrifice film, a SiN film is deposited and thereby embedded in the opening portion 18, as shown in FIG. 4C. The SiN film above the back gate conductor 3 is removed by a CMP (Chemical Mechanical Polishing). Thereby, the sacrifice film 19 is formed in the opening portion 18.

As shown in FIG. 4D, the stacked layer body 6 is formed by stacking the insulator 4 and the electrode film 5 alternately one after another on the back gate conductor 3 and the sacrifice film 19. Subsequently, the isolation insulator 7 is formed on the stacked layer body 6.

After that, as shown in FIG. 4E, through holes 20 are formed to reach the two end portions of the sacrifice film 19, by etching the isolation insulator 7 and the stacked layer body 6 by lithography and RIE until the etching reaches the sacrifice film 19. Such through holes 20 are formed at equal intervals in a matrix in the XY plane.

Subsequently, as a sacrifice film, a SiN film is deposited and thereby embedded in each through hole 20, as shown in FIG. 4F. A sacrifice film 21 is formed in each through hole 20 by CMP.

As shown in FIG. 5A, the sacrifice film 19 and the sacrifice films 21 are removed by wet etching using a hot phosphoric acid solution, for example. Thereby, the two end portions of the now-defunct opening portion 18 respectively communicate with the paired through holes 20, and an opening portion 22 shaped like the letter U is accordingly formed. The opening portion 22 is formed from the opening portion and the through holes 20.

As shown in FIG. 5B, the block insulator 11, the charge storage layer 10 and the tunnel insulator 9 are sequentially formed in the entire inside of the opening portion 22.

Amorphous silicon 23 is formed on the tunnel insulator inside the opening portion 22. In this process, the amorphous silicon 23 is not fully embedded in the opening portion 22, and a space portion 12a is accordingly left.

Subsequently, as shown in FIG. 5C, the embedded portions 12 each extending in the layered direction of the stacked layer body 6, to which fluorine is added, are formed on the inner surface of the amorphous silicon 23 in the stacked layer body 6. Each embedded portion 12 is a silicon oxide film formed by plasma CVD (Chemical Vapor Deposition) in which a concentration of fluorine is 1%, for example. The silicon oxide film, to which fluorine is added, is formed by plasma CVD using a mixed gas of $SiH_4$, $SiF_4$ and $N_2O$, for example. Incidentally, it is desirable that the concentration of fluorine needed to diffuse fluorine into the silicon film 8 should be not less than 0.1% but not greater than 10% as the atomic composition expressed in percentage. A silicon oxide film in which the concentration of fluorine is not less than 0.1% enhances the electron mobility in a transistor using poly-crystalline silicon. On the other hand, in a case where the concentration of fluorine is not less than 10%, it is difficult to form a silicon oxide film in which the electron mobility is equalized. In addition to the silicon oxide film, a silicon nitride film, a silicon oxynitride film, a layered film of a silicon oxide film and a silicon nitride film, or the like is used for the embedded portions 12. Incidentally, the embedded portions may be formed as portions containing fluorine and embedded in through holes formed in the silicon pillars 81.

Subsequently, each embedded portion 12, the amorphous silicon 23, the block insulator 11, the charge storage layer 10 and the tunnel insulator 9 protruding from the separation insulator 7 are removed by CMP, and thereby are flattened.

Thereafter, as the silicon film 8, a poly-crystalline silicon film is formed by crystallizing the amorphous silicon 23 through a heat treatment at a temperature in a range of 600° C. to 1250°, for example, at a temperature of 900° C. for one minute. During this step, the fluorine atoms in the embedded portions 12 are diffused into the poly-crystalline silicon film to form the silicon film 8 containing fluorine. As shown in FIG. 5D, portions of the silicon film 8, which are formed in the respective through holes 20, are termed as the silicon pillars 81. A portion of the silicon film 8, which is formed in the opening portion 18 so as to be connected to the silicon pillars 81, is termed as the silicon connection portion 82. The segregation of the diffused fluorine atoms in the grain boundaries in the poly-crystal causes fluorine to terminate the dangling bonds in the grain boundaries. Accordingly, the electron trap density can be reduced in the grain boundaries, and the electron mobility can be enhanced in the channel made of the poly-crystal, which is the silicon film 8.

Each embedded portion 12 extends in the Z direction, and the side surface of the embedded portion 12 is covered with the silicon film 8. In other words, the entire side surface of the embedded portion 12 is in contact with the silicon film 8. The structure mentioned above inhibits fluorine from diffusing into portions other than the silicon film 8, and the fluorine efficiently diffuses from the embedded portion 12 into the silicon film 8.

Use of a silicon oxide film for the embedded portions facilitates the diffusion of fluorine atoms into the poly-crystalline silicon film serving as the silicon film 8. For this reason, the heat treatment may be performed at a lower temperature. On the other hand, use of a silicon nitride film for the embedded portions 12 makes it more difficult to diffuse fluorine atoms. For this reason, the use of the silicon nitride film requires the heat treatment at a higher temperature than the use of the silicon oxide film. In this case, it is possible to make the electron mobility stable irrespective of the heat treatment step after the film formation of the embedded portions 12.

Figure 6A:
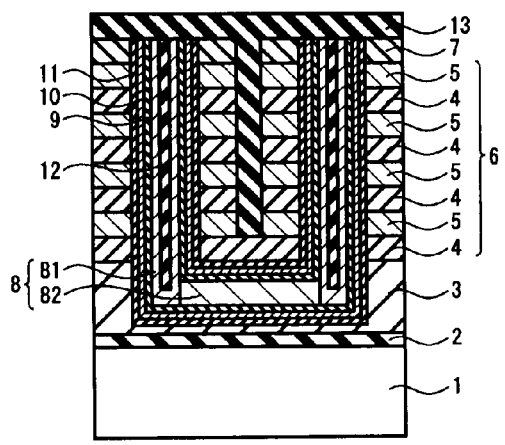
FIGS. 6A to 6D are cross-sectional views showing a method of fabricating a nonvolatile semiconductor memory device according to the embodiment.

Afterward, as the memory protection insulator 13, a silicon nitride film is formed above the stacked layer body 6, as shown in FIG. 5D. After that, a memory isolation groove 24 extending in the X direction is formed between the silicon pillars 81. Such memory isolation grooves 24 are provided at equal intervals in the XY plane. Subsequently, as the memory protection insulator 13, a silicon nitride film is embedded in the memory isolation groove 24, as shown in FIG. 6A.

Figure 6B:
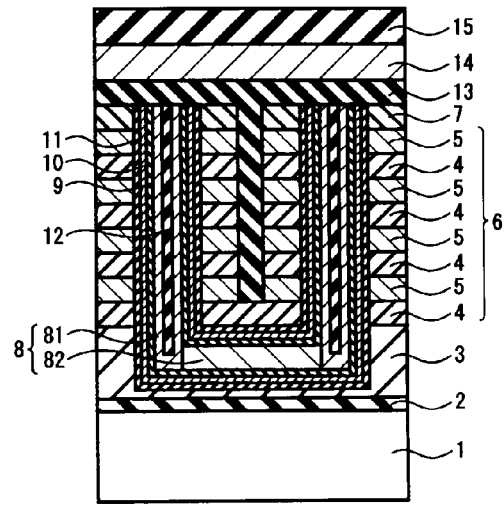

Thereafter, as shown in FIG. 6B, the select gate electrode 14 and the insulator layer 15 are formed. A poly-crystalline silicon film is used for the select gate electrode 14, and a silicon oxide film, for example, is used for the insulator layer 15.

Figure 6C:
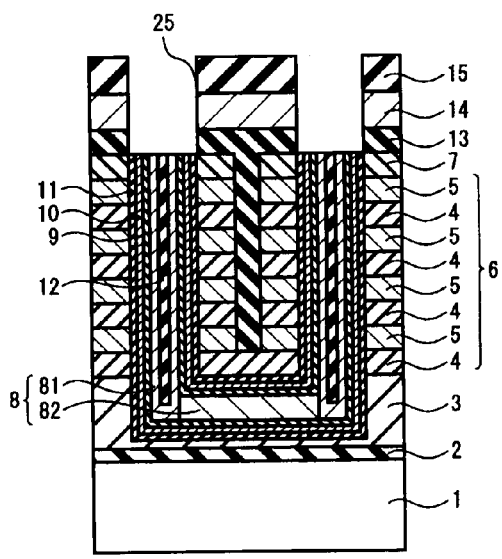

Afterward, as shown in FIG. 6C, through holes 25 are formed in portions of the stacked films above the silicon pillars 81 by lithography and RIE. The through holes 25 are formed to expose the respective silicon pillars 81.

Figure 6D:
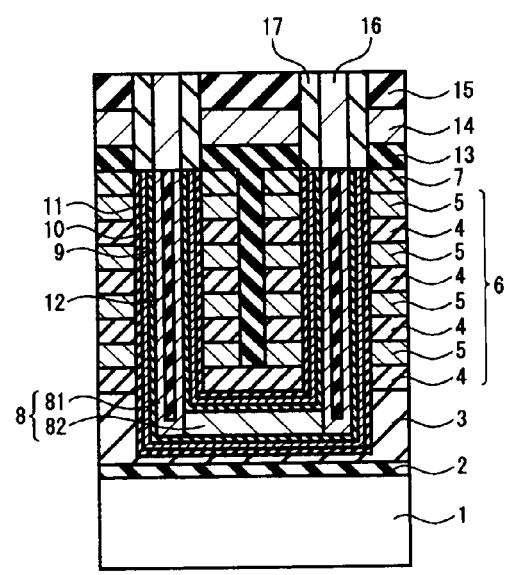

Afterward, as shown in FIG. 6D, the gate insulators 17 are formed on the inner surfaces of the through holes 25, respectively. Furthermore, as the silicon films 16, the poly-crystalline silicon film, for example, is embedded on the inner surfaces of the respective gate insulators 17.

Multiple mutually-isolated source lines SL extending in the X direction are formed, which are connected to the top portion of the silicon film 16 on one of the paired silicon pillars 81.

A plurality of mutually-isolated bit lines BL extending in the Y direction are formed, which are connected to the top portion of the silicon film 16 on the other one of the paired silicon pillars 81.

The nonvolatile semiconductor memory device according to the embodiment is formed through the foregoing steps.

As described above, fluorine is included in the silicon pillars 81 in the nonvolatile semiconductor memory device according to the embodiment. This structure reduces the electron trap density in the poly-crystal of the silicon film 8 serving as the channel, and accordingly enhances the electron mobility in the channel.

In addition, in the case where fluorine is included in the silicon film 8 formed from the silicon pillars 81 and the silicon connection portion 82, the electron trap density decreases in the poly-crystal of the silicon film 8 serving as the channel, and the electron mobility can be accordingly enhanced in the channel.

Furthermore, in the method of fabricating a nonvolatile semiconductor memory device according to the embodiment, the fluorine-containing embedded portions 12 are formed in contact with the corresponding silicon pillars 81, and fluorine atoms in the embedded portions 12 diffuse into the silicon pillars 81 or the silicon connection portion 82 through the heat treatment. Accordingly, it is possible to make fluorine atoms diffuse from the embedded portions 12 into the silicon pillars 81 or the silicon connection portion 82 not only in the front end but also continuously in the back end.

Figure 7:
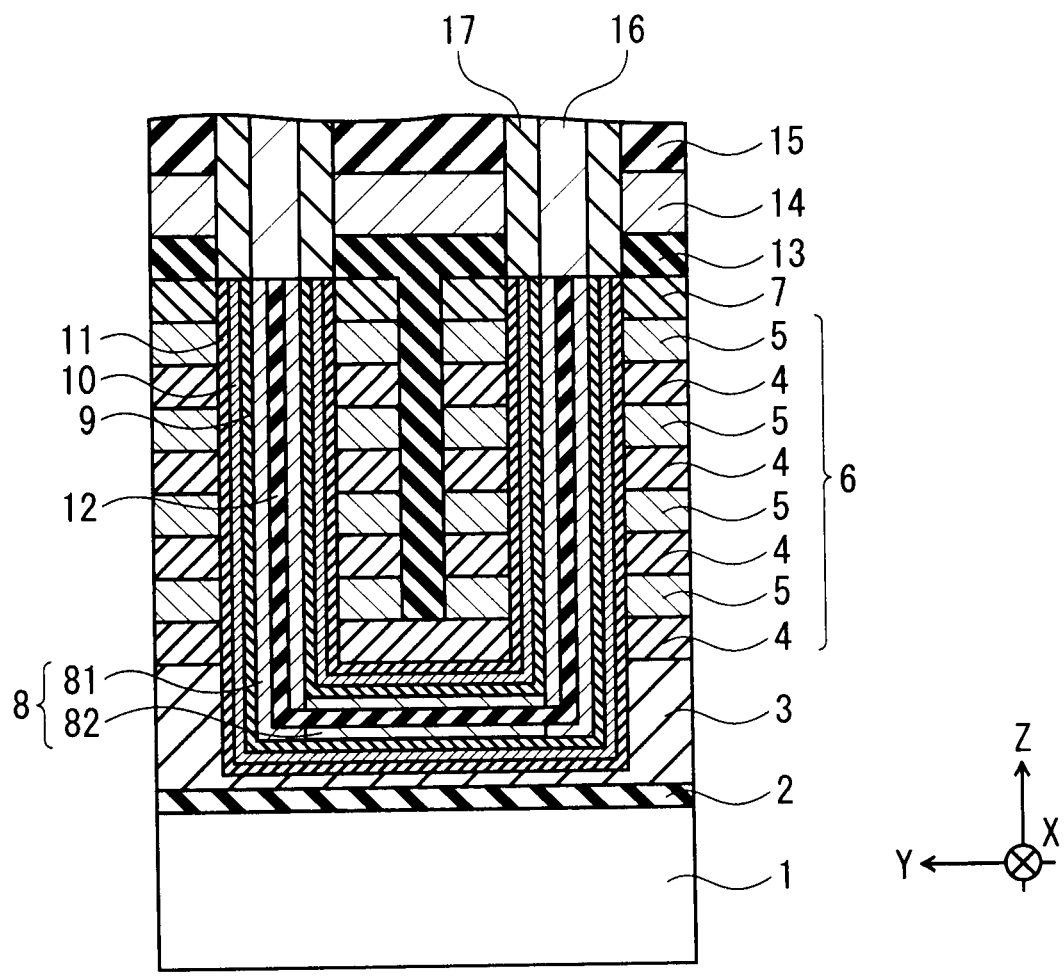
FIG. 7 is a cross-sectional view showing a nonvolatile semiconductor memory device according to the embodiment.

It should be noted that, as shown in FIG. 7 the fluorine-containing embedded portion 12 may be provided in the silicon connection portion 82 in the foregoing nonvolatile semiconductor memory device according to the embodiment. In this case, fluorine is supplied to the silicon connection portion 82 in the silicon film 8. This further decreases the electron trap density in the silicon film 8, and accordingly enhances the electron mobility in the channel.

It should be noted that, although the foregoing descriptions have been provided for the embodiment on the assumption that the lowermost ends of the silicon pillars 81 are connected together via the silicon connection portion 82, the silicon pillars 81 may be instead provided independently of each other without being provided with the silicon connection portion 82.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
   a substrate;
   a stacked layer body provided above the substrate, the stacked layer body alternately stacking an insulator and an electrode film one on another;
   silicon pillars containing fluorine, the silicon pillar penetrating through and provided in the stacked layer body;
   a tunnel insulator provided on a surface of the silicon pillar facing to the stacked layer body;
   a charge storage layer provided on a surface of the tunnel insulator facing to the stacked layer body;
   a block insulator provided on a surface of the charge storage layer facing to the stacked layer body, the block insulator being in contact with the electrode film; and
   an embedded portion provided in the silicon pillars,
   the embedded portion contains fluorine and is composed of at least one selected from a silicon oxide film, a silicon nitride film, a silicon oxy-nitride film and a layered film having at least two selected from the silicon oxide film, the silicon nitride film and the silicon oxy-nitride film.

2. The semiconductor device of claim 1, further comprising:
   a silicon connection portion containing fluorine connecting between a lower portion of one silicon pillar and a lower portion of the other silicon pillar.

3. The semiconductor device of claim 1, wherein
   a number of fluorine atoms at an uppermost portion is larger than a number of fluorine atoms at a lowermost portion in the silicon pillar.

4. The semiconductor device of claim 1, further comprising:
   a back gate insulator and a back gate conductive film provided sequentially from the substrate between both the stacked layer body and the block insulator, and the substrate.

5. The semiconductor device of claim 4, wherein
   a bottom surface of the block insulator being in contact with the back gate insulator is lower than a bottom surface of the stacked layer body being in contact with the back gate insulator.

6. The semiconductor device of claim 1, wherein
   a fluorine concentration of the silicon pillar ranges from 0.04% to 4% as atomic percentage.

7. The semiconductor device of claim 1, wherein
   the embedded portion has a reverse tapered shape.

8. The semiconductor device of claim 1, further comprising:

an isolation insulator provided on the stacked layer body, a memory protection film, a select gate film and an insulator layer sequentially provided on the isolation insulator.

9. The semiconductor device of claim 1, further comprising:
a silicon film provided on the silicon pillar, a gate insulator provided to surround the silicon film.

* * * * *